(12) United States Patent
Engholm et al.

(10) Patent No.: US 8,706,435 B2
(45) Date of Patent: Apr. 22, 2014

(54) SIGNAL DETECTION AND TRIGGERING USING A DIFFERENCE BITMAP

(75) Inventors: Kathryn A. Engholm, Portland, OR (US); John F. Turpin, Tigard, OR (US)

(73) Assignee: Tektronix, Inc., Beaverton, OR (US)

( * ) Notice: Subject to any disclaimer, the term of this patent is extended or adjusted under 35 U.S.C. 154(b) by 96 days.

(21) Appl. No.: 12/790,403

(22) Filed: May 28, 2010

(65) Prior Publication Data

US 2011/0273469 A1 Nov. 10, 2011

Related U.S. Application Data

(60) Provisional application No. 61/332,123, filed on May 6, 2010.

(51) Int. Cl.
*G01R 23/16* (2006.01)
*G01R 13/32* (2006.01)
*G01R 13/02* (2006.01)

(52) U.S. Cl.
CPC .................. *G01R 13/0263* (2013.01)
USPC ................ 702/77; 702/69; 702/195

(58) Field of Classification Search
CPC .................................................. G01R 13/0263
USPC ............... 702/66, 67, 76, 77, 108, 195
See application file for complete search history.

(56) References Cited

U.S. PATENT DOCUMENTS

| | | | | |
|---|---|---|---|---|
| 5,426,506 A | * | 6/1995 | Ellingson et al. | 356/369 |
| 5,550,385 A | * | 8/1996 | Nanami et al. | 250/584 |
| 6,218,976 B1 | * | 4/2001 | Eklund et al. | 341/161 |
| 6,493,400 B1 | | 12/2002 | Greeley | |
| 6,493,466 B1 | * | 12/2002 | Honda et al. | 382/236 |
| 6,570,592 B1 | * | 5/2003 | Sajdak et al. | 715/769 |
| 2005/0261847 A1 | | 11/2005 | Nara | |
| 2006/0212239 A1 | | 9/2006 | Letts | |
| 2007/0282542 A1 | | 12/2007 | Duff et al. | |
| 2007/0297548 A1 | * | 12/2007 | Tsukamoto et al. | 375/354 |
| 2009/0082982 A1 | * | 3/2009 | Cain | 702/77 |

FOREIGN PATENT DOCUMENTS

| | | |
|---|---|---|
| DE | 10047612 A1 | 8/2001 |
| EP | 0962781 A2 | 12/1999 |
| EP | 1755025 A2 | 2/2007 |
| EP | 2058668 A1 | 5/2009 |
| WO | 2006072255 A1 | 7/2006 |
| WO | 2008010608 A2 | 1/2008 |
| WO | 2009143466 A2 | 11/2009 |

OTHER PUBLICATIONS

U.S. Appl. No. 12/611,302, filed Nov. 3, 2009.

(Continued)

*Primary Examiner* — Jonathan C. Teixeira Moffat
*Assistant Examiner* — Regis Betsch
(74) *Attorney, Agent, or Firm* — Michael A. Nelson; Marger, Johnson & McCollom, P.C.

(57) ABSTRACT

A test and measurement instrument converts digital data that represents an input signal into a plurality of bitmaps, and then subtracts one of the bitmaps from another one of the bitmaps to produce a difference bitmap. The difference bitmap does not contain density values that are common to the two bitmaps, but instead only contains the density differences between the two, thereby revealing very small density variations in the presence of large density values. In some embodiments, the difference bitmap is displayed on a display device. In other embodiments, the difference bitmap is used to generate a trigger signal.

27 Claims, 8 Drawing Sheets

(56) References Cited

OTHER PUBLICATIONS

U.S. Appl. No. 12/568,141, filed Sep. 28, 2009.
U.S. Appl. No. 12/573,026, filed Oct. 2, 2009.
U.S. Appl. No. 13/039,062, filed Mar. 2, 2011.
European Search Report for Application No. 11161421.0, dated Feb. 13, 2013, 6 pages.

* cited by examiner

SIGNAL DETECTION AND TRIGGERING USING A DIFFERENCE BITMAP

CROSS-REFERENCE TO RELATED APPLICATIONS

This application claims the benefit of U.S. Provisional Patent Application No. 61/332,123 titled "Signal Detection and Triggering Using a Difference Bitmap" which was filed on May 6, 2010.

FIELD OF THE INVENTION

The present invention relates to test and measurement instruments, and more particularly to density bitmaps.

BACKGROUND OF THE INVENTION

Real-time spectrum analyzers such as the RSA6100 and RSA3400 families available from Tektronix, Inc. of Beaverton, Oreg. trigger on, capture, and analyze RF signals in real-time. These test and measurement instruments seamlessly capture RF signals so that, unlike conventional swept spectrum analyzers and vector signal analyzers, no data is missed within a specified bandwidth.

Tektronix real-time spectrum analyzers use a technology referred to as "Digital Phosphor" or alternatively as "DPX®" to produce a display referred to as a "DPX spectrum." A DPX spectrum is formed by transforming a continuous stream of digital data that represents an input signal into a series of frequency spectra in real-time and then accumulating the frequency spectra in a database. The database provides a precise measurement of the percentage of time during the measurement period that the input signal occupied particular locations in the amplitude or power versus frequency space, also referred to as "DPX Density®." DPX acquisition and display technology reveals signal details such as short-duration or infrequent events that are completely missed by conventional spectrum analyzers and vector signal analyzers. For more information on DPX, see Tektronix document number 37W-19638 titled "DPX® Acquisition Technology for Spectrum Analyzers Fundamentals" available at http://www.tek.com/.

SUMMARY OF THE INVENTION

In some instances, a user of a real-time spectrum analyzer may want to observe a very low density signal in the presence of a high density signal. For example, the user may want to observe a very small interference signal that occupies the same frequency range as a very high density signal, or some portion of that frequency range. Unfortunately, using a conventional DPX spectrum display, it can be difficult or impossible to discern such a small density variation, even after careful manipulation of the color scale controls.

The inventors of the present invention have recognized that, in order to overcome the deficiencies of the prior art discussed above, what is needed is a test and measurement instrument that is capable of detecting very small density variations in the presence of large density values.

Accordingly, embodiments of the present invention provide a test and measurement instrument that converts digital data that represents an input signal into a plurality of bitmaps, and then subtracts one of the bitmaps from another one of the bitmaps to produce a difference bitmap. The difference bitmap does not contain density values that are common to the two bitmaps, but instead only contains the density differences between the two, thereby revealing very small density variations in the presence of large density values. In some embodiments, the difference bitmap is displayed on a display device. In other embodiments, the difference bitmap is used to generate a trigger signal.

The objects, advantages, and other novel features of the present invention are apparent from the following detailed description when read in conjunction with the appended claims and attached drawings.

DETAILED DESCRIPTION OF THE INVENTION

Figure 1:
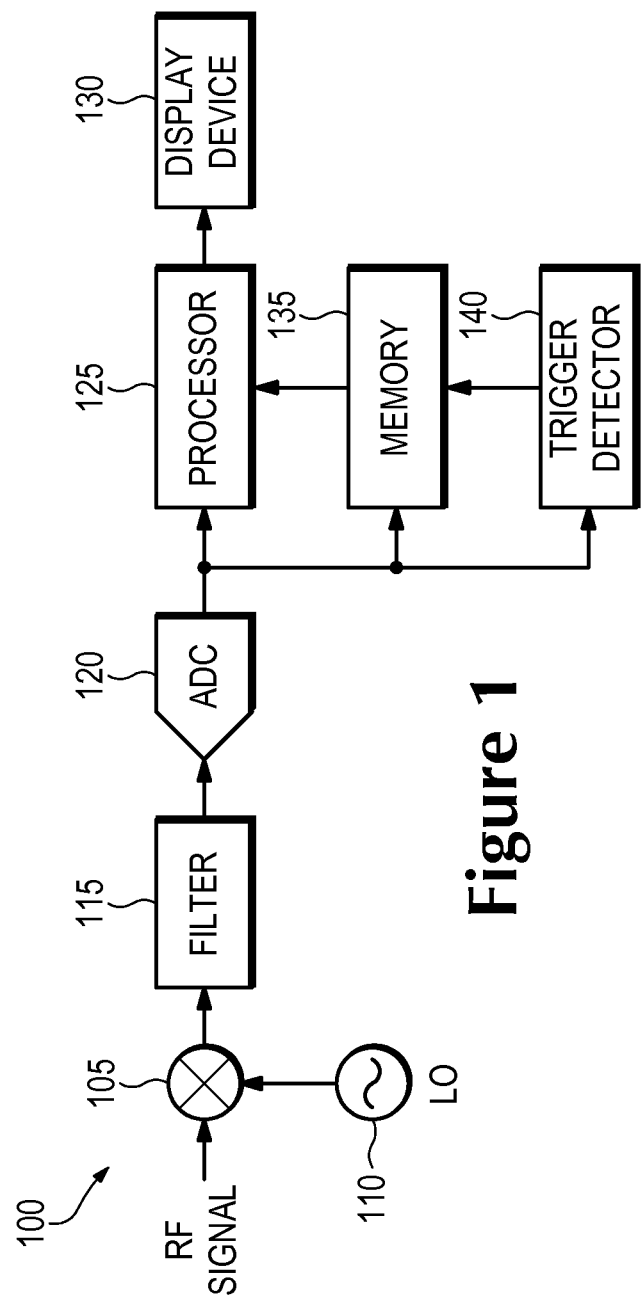
FIG. 1 depicts a high-level block diagram of a real-time spectrum analyzer.

Referring now to FIG. 1, a real-time spectrum analyzer 100 receives a radio frequency (RF) input signal and optionally down-converts it using a mixer 105, local oscillator (LO) 110, and filter 115 to produce an intermediate frequency (IF) signal. An analog-to-digital converter (ADC) 120 digitizes the IF signal to produce a continuous stream of digital data that represents the IF signal. The digital data is processed in two paths. In the first path, the digital data is input to a processor 125 that analyzes the digital data in real-time. In the second path, the digital data is input to a memory 135 (which, in some embodiments, comprises a circular buffer) and also input to a trigger detector 140 that processes the digital data in real-time and compares the processed data to a user-specified trigger criterion. When the processed digital data satisfies the trigger criterion, the trigger detector 140 generates a trigger signal that causes the memory 135 to store a block of digital data. The processor 125 then analyzes the stored digital data. After processing by processor 125, the digital data may be displayed on the display device 130 or stored in a storage device (not shown).

Figure 2:
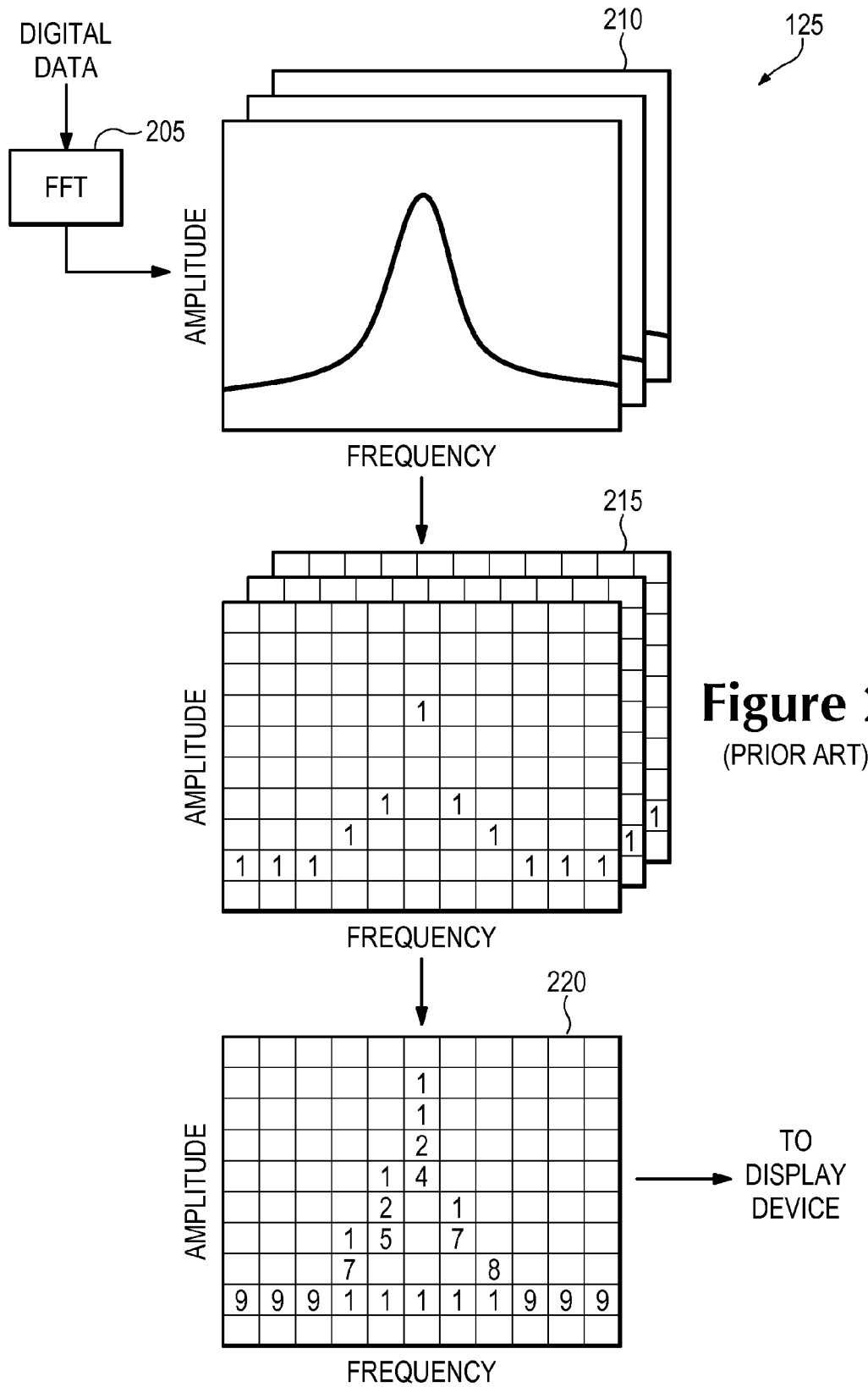
FIG. 2 depicts a high-level functional block diagram of the processor shown in FIG. 1.

Referring now to FIG. 2, in order to provide DPX processing, the processor 125 uses a frequency transform 205 such as a fast Fourier transform (FFT), a chirp-Z transform, or the like to transform the continuous stream of digital data into a series of frequency spectra 210 in real-time. The spectra 210 are then accumulated in a data structure referred to as a "bitmap database" 220, sometimes referred to herein as a "density bitmap" or alternatively as a "bitmap." The spectra 210 may be accumulated in various ways. In one embodiment, each spectrum 210 is rasterized to produce a "rasterized spectrum" 215. A rasterized spectrum comprises an array of cells arranged in of a series of rows and columns, with each row representing a particular amplitude value and each column representing a particular frequency value. The value of each cell is either a "1," also referred to as a "hit," which indicates that the input signal was present at that particular location in the amplitude versus frequency space during the measurement period, or a "0" (depicted as a blank cell), which indicates that it was not. The values of the corresponding cells of the rasterized spectra 215 are summed together to form the bitmap database 220, and then the value of each cell of the bitmap database 220 is divided by the total number of rasterized spectra 215 so that it indicates the total number of hits during the measurement period divided by the total number of rasterized spectra 215, or equivalently, the percentage of time during the measurement period that the input signal occupied that particular location in the amplitude versus frequency space, also referred to as "DPX Density®" or alternatively "density." The rasterized spectra 215 and the bitmap database 220 are depicted as having ten rows and eleven columns for simplicity, however it will be appreciated that in an actual embodiment, the rasterized spectra 215 and the bitmap database 220 may have hundreds of rows and columns. The bitmap database 220 is essentially a three-dimensional histogram, with the x-axis being frequency, the y-axis being amplitude, and the z-axis being density. The bitmap database 220 may be displayed on the display device 145 with the density of each cell being represented by a color-graded pixel. Alternatively, the bitmap database 220 may be stored in a storage device (not shown). In some cases, the series of frequency spectra 210 is converted into a plurality of bitmap databases 220 by organizing the series of frequency spectra 210 into sets of one or more frequency spectra 210 referred to as "frames" and then converting each frame into a bitmap database 220.

Figure 3:
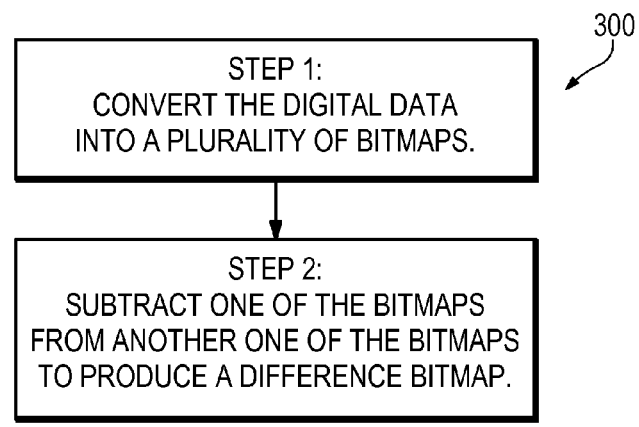
FIG. 3 depicts a flowchart of a method according to an embodiment of the present invention.

Referring now to FIG. 3, in some embodiments of the present invention, the processor 125 processes the digital data by performing the steps of (1) converting the digital data into a plurality of bitmaps and (2) subtracting one of the bitmaps referred to as a "reference bitmap" from another one of the bitmaps referred to as a "bitmap under test" to produce a "difference bitmap." The difference bitmap does not contain the density values that are common to the two bitmaps, but instead only contains the density differences between the two.

Figure 4:
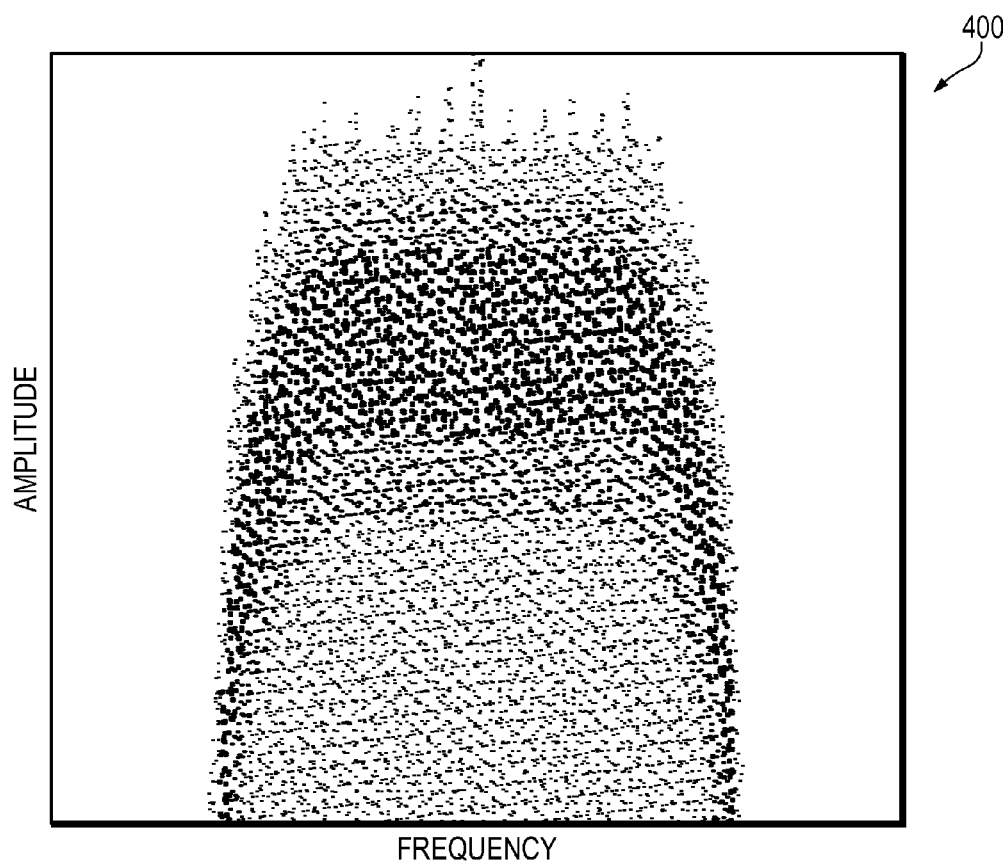
FIG. 4 depicts a first bitmap.
Figure 5:
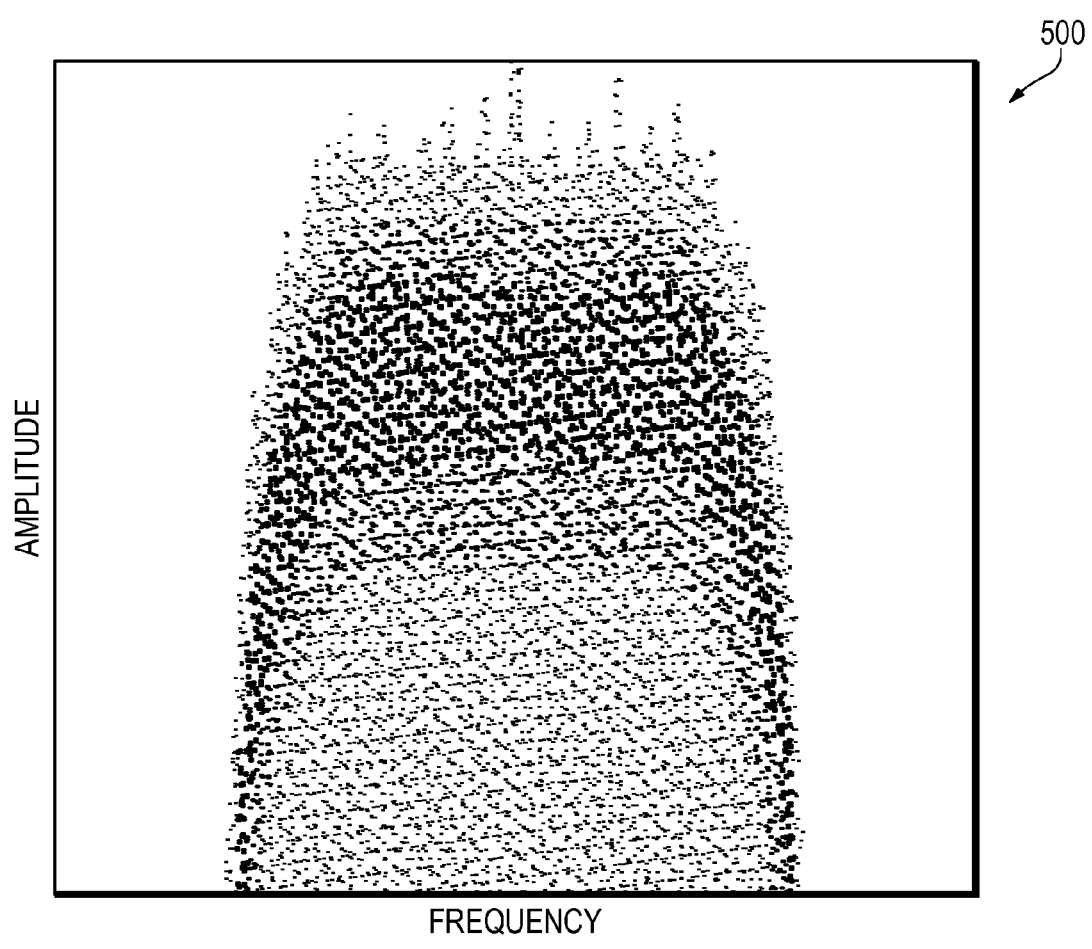
FIG. 5 depicts a second bitmap.

The following example illustrates how a difference bitmap can reveal very small density variations in the presence of large density values. Consider the bitmap 400 shown in FIG. 4 and the bitmap 500 shown in FIG. 5. Both bitmaps 400 and 500 were created from the same stream of digital data but at different times. In order to provide a more realistic depiction of an actual bitmap, the bitmaps 400 and 500 are depicted as having hundreds of rows and columns, the gridlines of which are not shown, and the color-grading of which is depicted as grey-scale with darker shades of grey indicating that the signal was present more often. Both bitmaps 400 and 500 depict a Quadrature Phase Shift Keying (QPSK) signal. The darkest density values indicate that the QPSK signal was present at that location in the power or amplitude versus frequency space a significant portion of the time during the measurement interval. Note that the bitmap 400 appears to be virtually identical to the bitmap 500.

Figure 6:
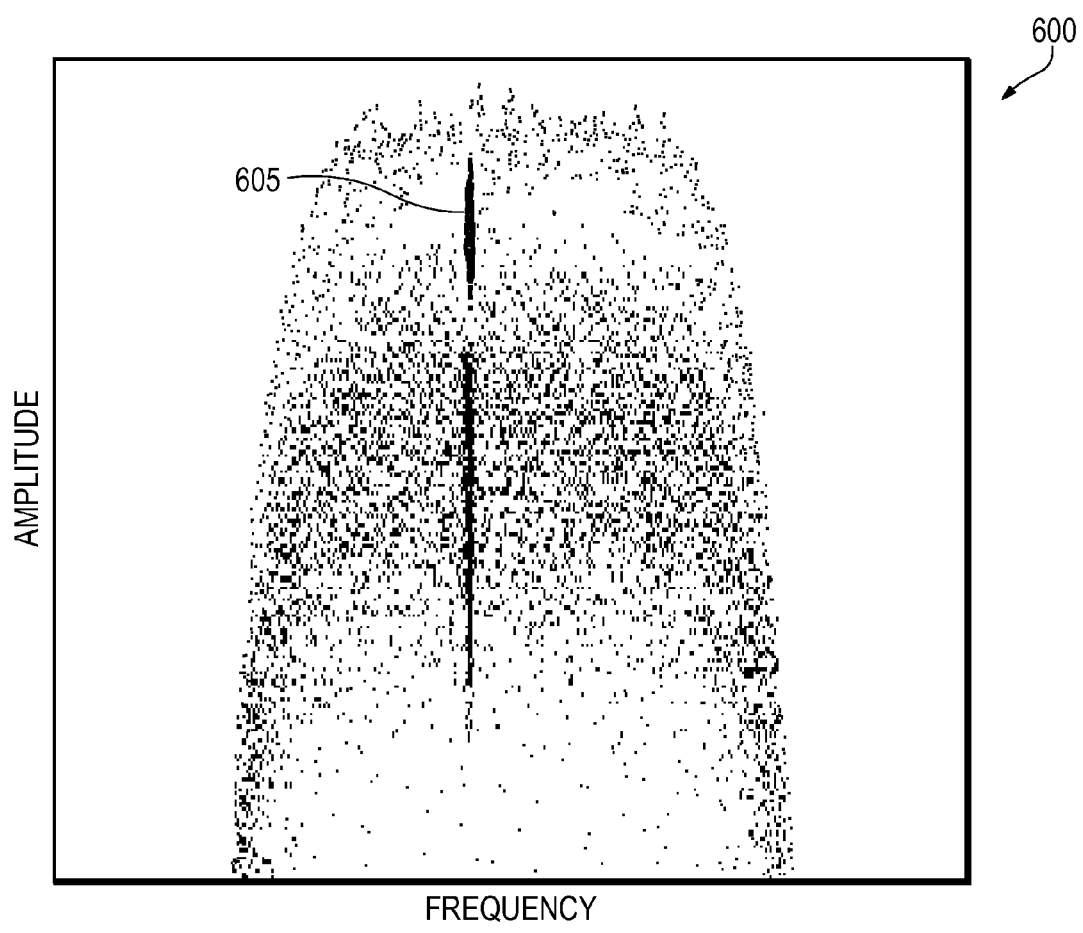
FIG. 6 depicts a difference bitmap.

Subtracting the bitmap 400 from the bitmap 500 produces a difference bitmap 600 as shown in FIG. 6, where the color scaling is expanded to show a smaller range of density difference values, including both positive and negative density differences. The difference bitmap 600 reveals an interference signal 605 that is 20 dB below the QPSK signal. The interference signal 605 was present in bitmap 500 but not in bitmap 400. Note that the interference signal 605 can be easily seen even though its peak density value is only 0.00002% (i.e., 20 micro-percent), in contrast to the QPSK signal which was present a significant portion of the time.

In some embodiments, the processor 125 converts the continuous stream of digital data is into a series of bitmaps in real-time and subtracts a reference bitmap from each newly created bitmap, thereby monitoring the input signal for very small density variations in real-time. In this case, it may be advantageous to occasionally update the reference bitmap in order to reject low-frequency changes in the input signal such as amplitude drift, frequency wander, and the like. In this manner, the test and measurement instrument can "track-out" slow changes in the input signal, and thereby detect only changes that occur more quickly than the reference bitmap is updated. For example, if the reference bitmap is updated every 50 milliseconds, then, first order, the difference bitmap will only reveal changes in the input signal that occur within 50 milliseconds.

The reference bitmap may be updated in various ways. In some embodiments, the reference bitmap is updated in response to a user command. In other embodiments, the reference bitmap is updated in response to a signal that is generated internally or externally to the real-time spectrum analyzer 100.

Figure 7:
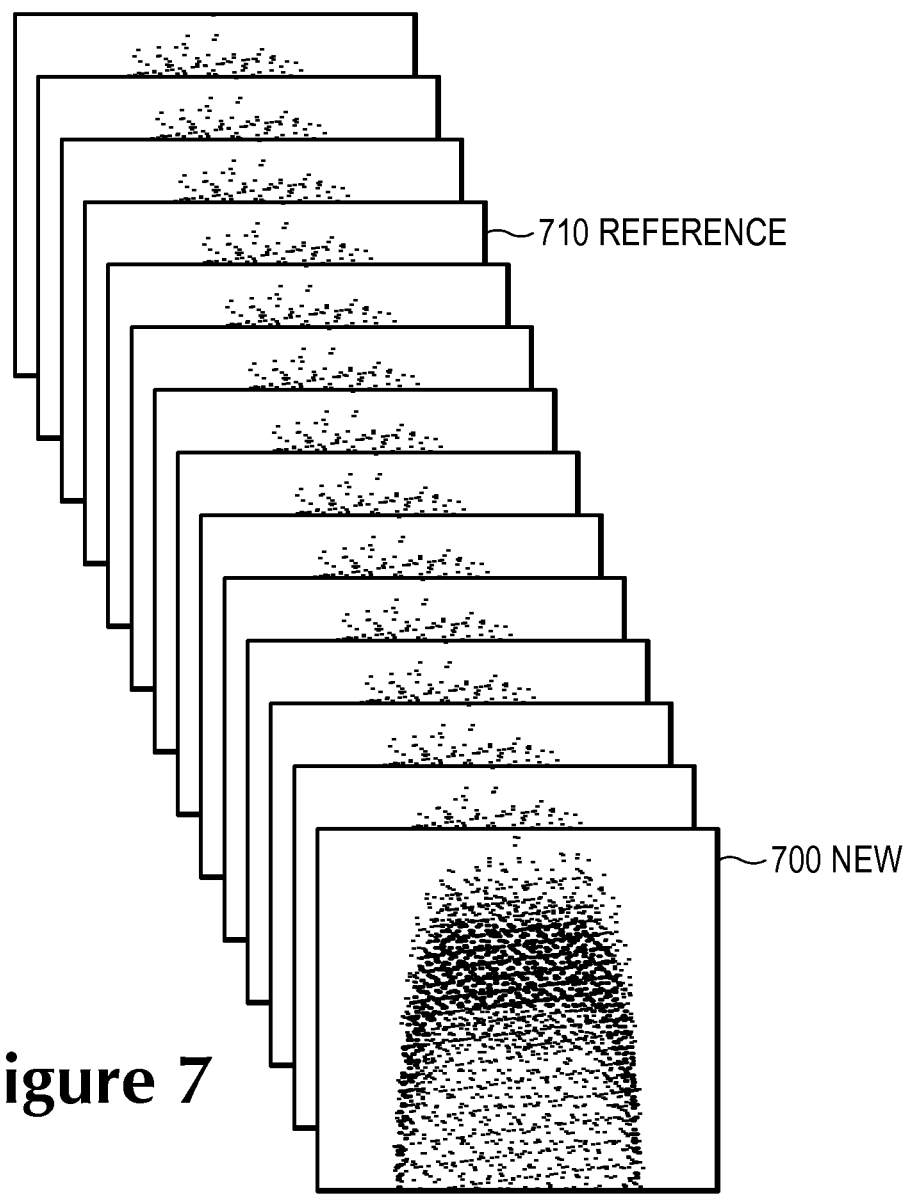
FIG. 7 depicts a visualization of a first manner of updating a reference bitmap.

In some embodiments, the processor 125 updates the reference bitmap periodically. The reference bitmap may be updated periodically in various ways. In some embodiments, the reference bitmap is updated after each bitmap is created. This can be accomplished by storing new bitmaps as they are created in a First-In, First-Out (FIFO) memory structure, with the reference bitmap being whatever bitmap happens to be stored in a user-specified slot of the FIFO. FIG. 7 depicts a visualization of an example of this embodiment in which thirteen bitmaps are stored in a FIFO. The user-specified slot is the tenth slot, and thus the reference bitmap 710 is whatever bitmap happens to be stored in the tenth slot. In this manner, the reference bitmap 710 is always ten bitmaps prior to the newly-created bitmap 700. Thus, the reference bitmap "rolls" through time at the same rate that new bitmaps are created.

Figure 8:
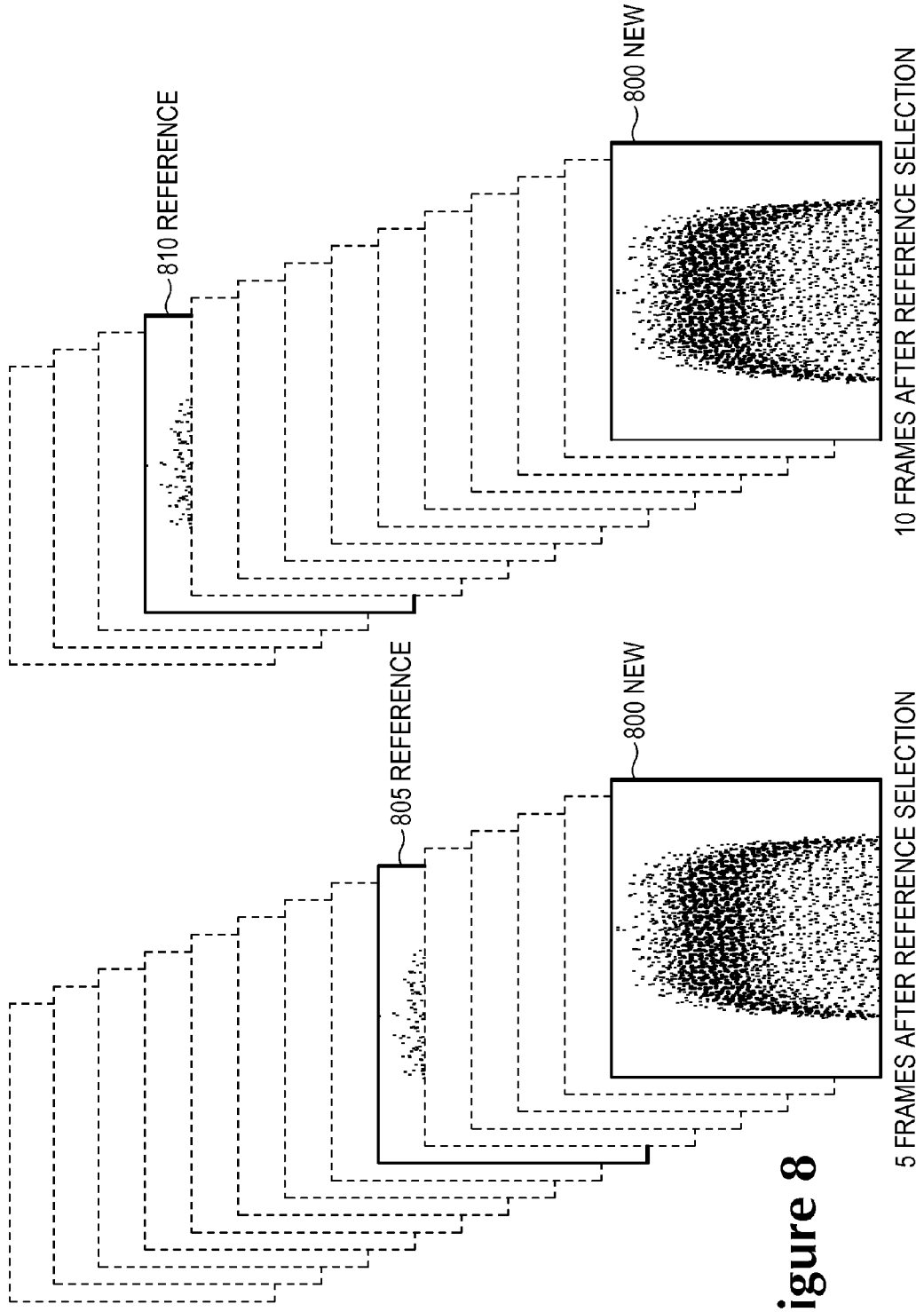
FIG. 8 depicts two views of a visualization of a second manner of updating a reference bitmap.

In other embodiments, the reference bitmap is updated after every N bitmaps is created, where N is a user-specified integer greater than one. For example, the reference bitmap may be updated with a more recently created bitmap after every ten bitmaps is created. In that case, after the reference bitmap is updated, it is subtracted from the next ten bitmaps to generate ten difference bitmaps, and then the reference bitmap would be updated again. This manner of updating the reference bitmap can also be visualized in terms of a FIFO. For example, FIG. 8 shows two views of the same FIFO at two different times, one in which the reference bitmap 805 is five bitmaps prior to the newly created bitmap 800, and one in which the reference bitmap 810 is ten bitmaps prior to the newly created bitmap 800, with the other slots of the FIFO being empty. It will be appreciated that this method of updating the reference bitmap advantageously reduces the amount of memory required to store bitmaps compared to the method described in the previous paragraph.

In cases in which a difference bitmap is displayed on the display device 130, the difference bitmap may be processed in order to make density differences easier to see by applying smoothing, filtering, emphasizing density differences above a user-specified value, de-emphasizing density differences below a user-specified value, and so on. In particular, in cases in which the input signal is monitored for very small density variations in real-time, it may be advantageous to apply persistence so that a brief transient signal remains visible on the display device 130 long enough for a user to observe it.

In some embodiments, a difference bitmap is used to perform a measurement. It will be appreciated that a difference bitmap may be used to perform many of the measurements that are available on a real-time spectrum analyzer that normally operate on a conventional bitmap, although the results of those measurements may have significantly different meanings.

In some embodiments, the processor 125 collects a plurality of sequential bitmaps, subtracts the plurality of sequential bitmaps from a single reference bitmap to produce a plurality of difference bitmaps that represent a plurality of different measurement intervals, measures the density differences of each of the difference bitmaps to produce a plurality of density difference measurements, and then provides those density difference measurements in the form of a display of density difference versus measurement interval. In this manner, the processor 125 may help a user identify the period of intermittent interference signals present in the input signal.

At any one pixel location, a positive density difference indicates that the bitmap under test had more hits at that location than the reference bitmap, meaning that the input signal spent more time at that particular amplitude and less time at a higher or lower amplitude.

Figure 9:
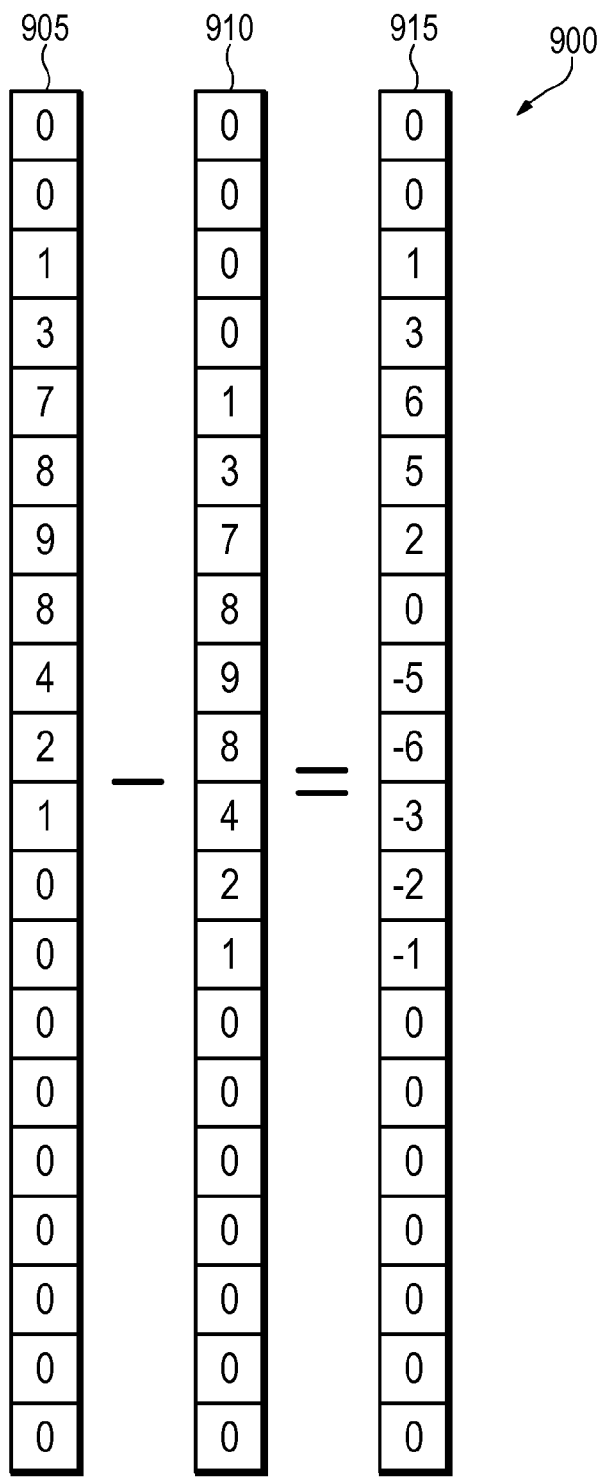
FIG. 9 illustrates how a column of a reference bitmap is subtracted from a column of a bitmap under test to produce a column of a difference bitmap.

Considering only one frequency column, a positive density difference located above a negative density difference indicates that the bitmap under test depicts a signal that is not present in the reference bitmap, or in other words, it indicates that the signal "appeared." Conversely, a positive density difference located below a negative density difference indicates that the reference bitmap depicts a signal that is not present in the bitmap under test, or in other words, it indicates that the signal "disappeared." This is because, when an additional signal of any kind is introduced into a frequency band, it increases the total power level in that frequency band. Conversely, when a signal is removed from a frequency band, it decreases the total power level in that frequency band. Consider the following example: The column 910 shown in FIG. 9 represents one column of a reference bitmap, where the number shown in each pixel represents the number of hits to that pixel. The pattern of hits in the column 910 represents a normal distribution of noise. The mean of the noise distribution, which is indicated by the pixel containing nine hits, is located nine pixels from the top of the column 910. Next consider the column 905 which represents one column of a bitmap under test. There, an additional signal has been introduced into the frequency band which increases the total power in the frequency band by the power of the additional signal, or in other words, it shifts the noise distribution vertically by two pixels. Thus, the mean of the noise distribution is now located seven pixels from the top of the column 905. The column 915 represents one column of a difference bitmap, formed by subtracting the column 910 of the reference bitmap from the column 905 of the bitmap under test. At the seventh pixel from the top of the column 915, the density difference equals 9−7=2. Two pixels down, at the ninth pixel from the top of the column 915, the density difference equals 4−9=−5. Thus, as stated above, a positive density difference (2) located above a negative density difference (−5) indicates that the additional signal "appeared." The pattern reverses when the additional signal is present in the reference bitmap but not present in the bitmap under test, producing positive density differences at lower amplitudes and negative density differences at higher amplitudes. In some embodiments, the processor 125 indicates when a signal appears or disappears within the difference bitmap. In other embodiments, the processor 125 indicates when a signal appears or disappears within a user-specified portion of the difference bitmap.

In some embodiments of the present invention, the trigger detector 140 processes the digital data by performing the steps of (1) converting the digital data into a plurality of bitmaps and (2) subtracting one of the bitmaps referred to as a "reference bitmap" from another one of the bitmaps referred to as a "bitmap under test" to produce a "difference bitmap." When the difference bitmap satisfies a user-specified trigger criterion, the trigger detector 140 generates a trigger signal. As described above, the trigger signal causes the memory 135 to store a block of digital data, which are then analyzed by the processor 125, and the results may be displayed on the display device 130 or stored in a storage device (not shown). The user-specified trigger criterion can take many forms. For example, in some embodiments the trigger detector 140 generates the trigger signal when the peak density difference within the difference bitmap exceeds a user-specified density threshold. In other embodiments the trigger detector 140 generates the trigger signal when the peak density difference within a user-specified portion of the difference bitmap exceeds a user-specified density threshold. In various other embodiments, the difference bitmap is used in the place of a conventional bitmap in any one of various triggering schemes that trigger based on conventional bitmaps and the user-specified trigger criterion is defined by those triggering schemes. Examples of such triggering schemes include co-pending U.S. patent application Ser. No. 12/568,141 titled "Frequency Domain Bitmap Triggering Using Color, Density and Correlation Based Triggers" which was filed on Sep. 28, 2009 and co-pending U.S. patent application Ser. No. 12/779,732 titled "Signal Recognition and Triggering Using Computer Vision Techniques" which was filed on May 13, 2010.

In various embodiments, the processor 125 and the trigger detector 140 may be implemented in hardware, software, or a combination of the two, and may comprise and/or be executed on a general purpose microprocessor, a digital signal processor (DSP), an application specific integrated circuit (ASIC), a field-programmable gate array (FPGA), or the like.

Although the embodiments above describe a difference bitmap as being calculated by subtracting a reference bitmap from a bitmap under test, it will be understood that a substantially equivalent difference bitmap may be calculated by subtracting a bitmap under test from a reference bitmap. This second calculation provides a result that is negative but otherwise identical.

Although the embodiments described above are described in the context of a real-time spectrum analyzer, it will be appreciated that the principles described herein are equally applicable to any test and measurement instrument that is capable of accumulating multiple acquisitions of an input signal such as a swept spectrum analyzer, a vector signal analyzer, a logic analyzer, and an oscilloscope. For example, in some embodiments of the present invention, an oscilloscope converts digital data that represents an input signal into a plurality of eye diagrams, and then subtracts one of the eye diagrams from another one of the eye diagrams to produce a difference eye diagram that reveals very small intermittent signals that are present in the input signal. In that case, the bitmap is not a frequency-domain bitmap as described above, but rather represents an accumulation of sampled voltage values in the time-domain.

It will be appreciated from the foregoing discussion that the present invention represents a significant advance in the field of test and measurement equipment. Although specific embodiments of the invention have been illustrated and described for purposes of illustration, it will be understood that various modifications may be made without departing from the spirit and scope of the invention. Accordingly, the invention should not be limited except as by the appended claims.

What is claimed is:

1. A test and measurement instrument comprising:
an analog-to-digital converter for receiving an input radio frequency signal and producing a digital signal; and
a processor configured to:
process digital data from the digital signal by converting it into a series of temporal frequency spectra by frequency transform,
accumulate the frequency spectra in a plurality of bitmaps by rasterizing each frequency spectrum, each rasterized frequency spectrum comprising an array of cells, and summing the values of each corresponding cell of each rasterized frequency spectrum in a particular frame to form one of the plurality of bitmaps, and
subtract one of the bitmaps referred to as a reference bitmap from another one of the bitmaps to produce a density difference bitmap.

2. A test and measurement instrument as in claim 1 wherein the processor processes the digital data in real-time.

3. A test and measurement instrument as in claim 1 wherein the processor processes the digital data after it has been stored in a memory in response to a trigger signal.

4. A test and measurement instrument comprising:
an analog-to-digital converter for receiving an input signal and producing a digital signal;
a trigger detector for processing digital data from the digital signal by:
converting it into a series of temporal frequency spectra by frequency transform,
accumulating the frequency spectra in a plurality of bitmaps by rasterizing each frequency spectrum, each rasterized frequency spectrum comprising an array of cells, and summing the values of each corresponding cell of each rasterized frequency spectrum to form the plurality of bitmaps, and
subtracting one of the bitmaps referred to as a reference bitmap from another one of the bitmaps to produce a density difference bitmap, and for generating a trigger signal when the density difference bitmap satisfies a user-specified trigger criterion; and
a memory for storing digital data from the digital signal in response to the trigger signal.

5. A test and measurement instrument as in claim 2 wherein the processor converts the digital data into a series of bitmaps in real-time and subtracts the reference bitmap from each newly created bitmap.

6. A test and measurement instrument as in claim 5 wherein the processor updates the reference bitmap.

7. A test and measurement instrument as in claim 6 wherein the processor updates the reference bitmap in response to a user command.

8. A test and measurement instrument as in claim 6 wherein the processor updates the reference bitmap in response to a signal that is generated internally or externally to the test and measurement instrument.

9. A test and measurement instrument as in claim 6 wherein the processor updates the reference bitmap periodically.

10. A test and measurement instrument as in claim 9 wherein the processor updates the reference bitmap after each bitmap is created.

11. A test and measurement instrument as in claim 9 wherein the processor updates the reference bitmap after every N bitmaps is created, where N is a user-specified integer that is greater than one.

12. A test and measurement instrument as in claim 1 wherein the density difference bitmap is displayed on a display device.

13. A test and measurement instrument as in claim 1 wherein the processor uses the density difference bitmap to perform a measurement.

14. A test and measurement instrument as in claim 1 wherein the processor indicates when a signal appears or disappears within the density difference bitmap.

15. A test and measurement instrument as in claim 1 wherein the test and measurement instrument is a test and measurement instrument selected from the group consisting of a realtime spectrum analyzer, a swept spectrum analyzer, a vector signal analyzer, a logic analyzer, and an oscilloscope.

16. A test and measurement instrument as in claim 4 wherein the trigger detector converts the digital data into a series of bitmaps in real-time and subtracts the reference bitmap from each newly created bitmap.

17. A test and measurement instrument as in claim 16 wherein the trigger detector updates the reference bitmap.

18. A test and measurement instrument as in claim 17 wherein the trigger detector updates the reference bitmap in response to a user command.

19. A test and measurement instrument as in claim 17 wherein the processor updates the reference bitmap in response to a signal that is generated internally or externally to the test and measurement instrument.

20. A test and measurement instrument as in claim 17 wherein the trigger detector updates the reference bitmap periodically.

21. A test and measurement instrument as in claim 20 wherein the trigger detector updates the reference bitmap after each bitmap is created.

22. A test and measurement instrument as in claim 20 wherein the trigger detector updates the reference bitmap after every N bitmaps is created, where N is a user-specified integer that is greater than one.

23. A test and measurement instrument as in claim 4 wherein the density difference bitmap is displayed on a display device.

24. A test and measurement instrument as in claim 4 wherein the trigger detector uses the density difference bitmap to perform a measurement.

25. A test and measurement instrument as in claim 4 wherein the trigger detector indicates when a signal appears or disappears within the density difference bitmap.

26. A test and measurement instrument as in claim 4 wherein the test and measurement instrument is a test and measurement instrument selected from the group consisting of a realtime spectrum analyzer, a swept spectrum analyzer, a vector signal analyzer, a logic analyzer, and an oscilloscope.

27. A test and measurement instrument as in claim 4 wherein the density difference bitmap satisfies the user-specified trigger criterion when a density difference within the density difference bitmap exceeds a user-specified density threshold.

* * * * *